(12) United States Patent
Kim et al.

(10) Patent No.: US 11,152,253 B2
(45) Date of Patent: Oct. 19, 2021

(54) SEMICONDUCTOR STRUCTURE AND METHOD FOR FABRICATING THE SAME

(71) Applicant: XIA TAI XIN SEMICONDUCTOR (QING DAO) LTD., Qingdao (CN)

(72) Inventors: Jee-Hoon Kim, Singapore (SG); Hyunyoung Kim, Singapore (SG); Kang-Won Seo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 26 days.

(21) Appl. No.: 16/739,126

(22) Filed: Jan. 10, 2020

(65) Prior Publication Data
US 2021/0217658 A1 Jul. 15, 2021

(51) Int. Cl.
*H01L 21/768* (2006.01)
*H01L 23/52* (2006.01)
*H01L 23/522* (2006.01)

(52) U.S. Cl.
CPC .. *H01L 21/76816* (2013.01); *H01L 21/76843* (2013.01); *H01L 23/5226* (2013.01)

(58) Field of Classification Search
CPC ........... H01L 21/76816; H01L 23/5226; H01L 21/76843
USPC ....................................................... 257/774
See application file for complete search history.

(56) References Cited

U.S. PATENT DOCUMENTS

| 5,716,890 A * | 2/1998 | Yao | H01L 21/02274 438/624 |
| 6,506,690 B1 * | 1/2003 | Lobbins | H01L 21/0214 438/783 |
| 6,844,612 B1 * | 1/2005 | Tian | H01L 21/31629 257/634 |

* cited by examiner

*Primary Examiner* — Caleen O Sullivan
(74) *Attorney, Agent, or Firm* — ScienBiziP, P.C.

(57) ABSTRACT

A semiconductor structure and a method of fabricating the same is disclosed. The structure comprises: a substrate having a device region; a contact plug arranged over the device region and enables electrical connection to a semiconductor device in the device region; a separation layer arranged above and exposing the contact plug; a cylindrical tubular metal feature arranged above the separation layer; and a dielectric layer laterally surrounding the cylindrical tubular conductive feature, having a substantially stepped dopant concentration distribution comprised of two distinct dopant species. The dopant concentration level decreases from a lower region nearest the separation layer toward an upper region farther from the separation layer. An inter-dopant ratio between the distinct dopant species increases from the lower region toward the upper region. The cylindrical tubular metal feature has a sidewall profile that is substantially perpendicular to a surface of the substrate.

16 Claims, 15 Drawing Sheets

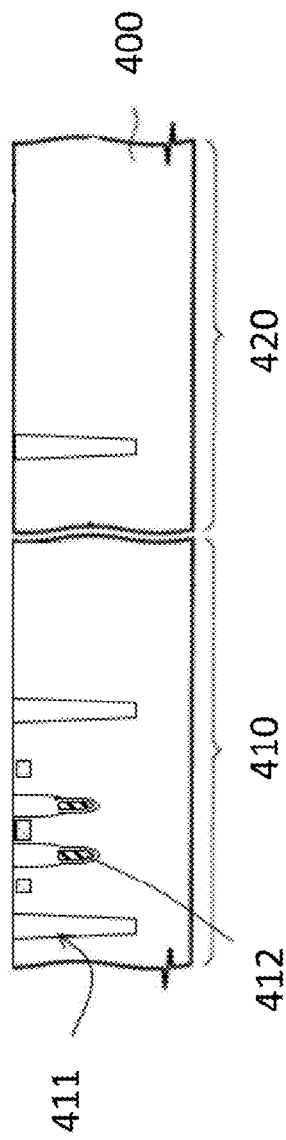

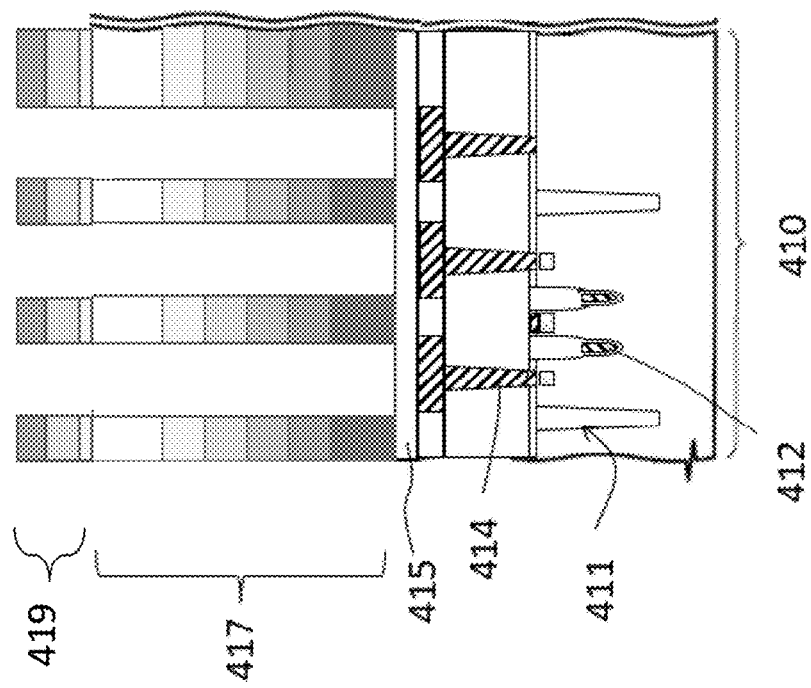

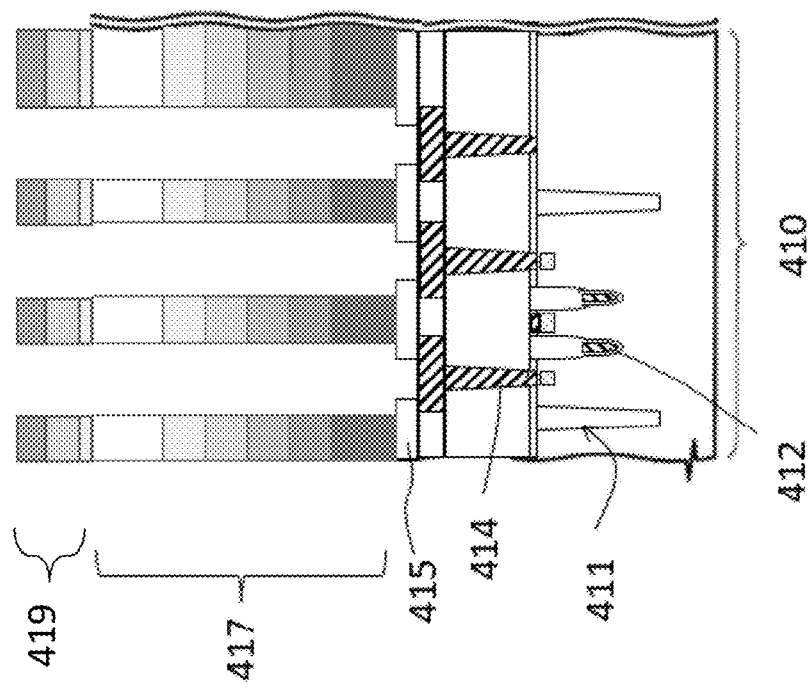

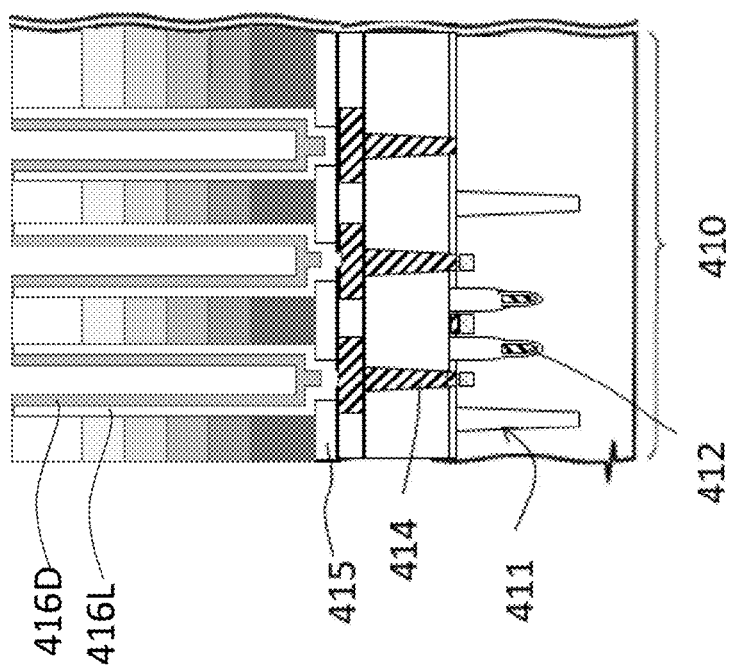

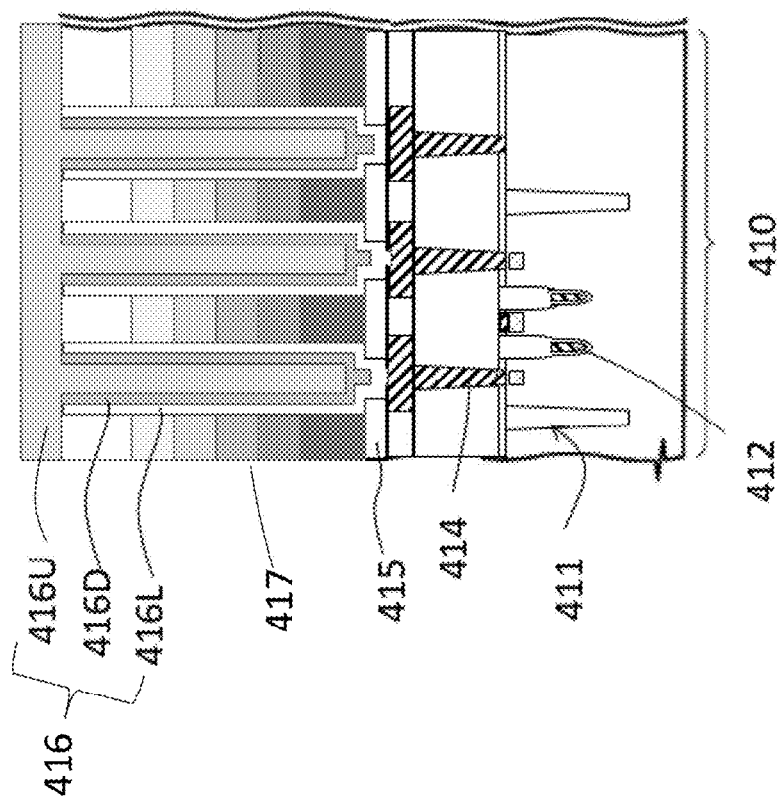

SEMICONDUCTOR STRUCTURE AND METHOD FOR FABRICATING THE SAME

FIELD

The present disclosure generally relates to fabrication of semiconductor device, and more particularly pertains to generation of high aspect ratio integrated circuit (IC) components in semiconductor devices.

BACKGROUND

As integrated circuits (IC) are developed, the desire for higher device density and operation speed becomes never-ending quests for those skilled in the art. To enable higher degree of vertical integration, high aspect ratio features are utilized. However, in the trend of ever-decreasing critical feature dimensions, the generation of high aspect ratio features becomes a challenge. For one thing, as the aspect ratio of a vertical IC component increases, the lateral profile of the device component often assumes a reversed taper shape (e.g., having non-uniform width from top to bottom; in most cases, a wider top and narrow bottom) due to limitations of etching techniques during fabrication processes. An inverted taper profile in high aspect ratio components may generate adverse effects that impact a semiconductor device's performance. For instance, the narrow lower end of a high aspect ratio interconnect feature may yield a reduced contact area with a lower device layer, thus leads to increased contact resistance.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4J show exemplary fabrication processes of a semiconductor device in accordance with some embodiments of the instant disclosure.

Figure 1:
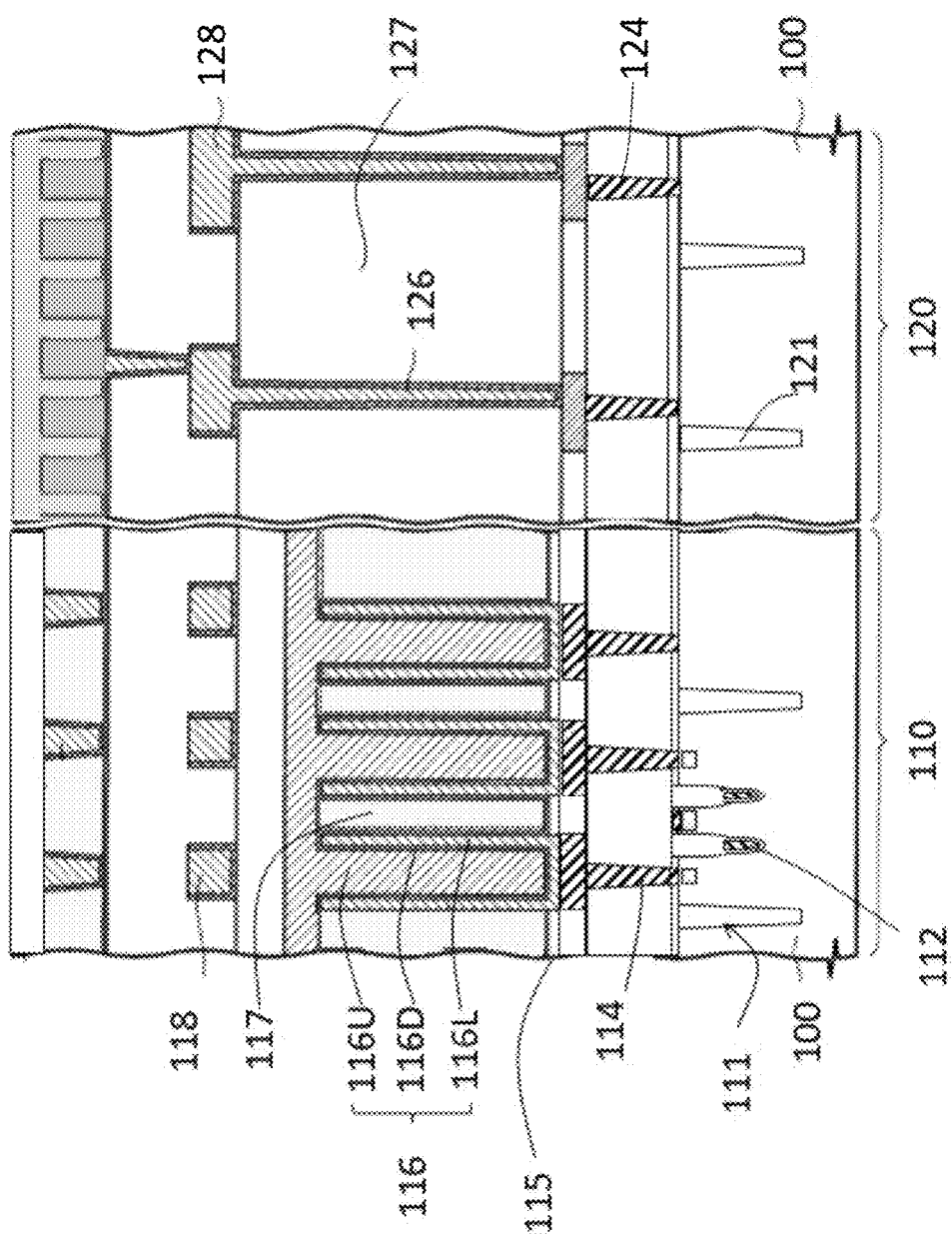
FIG. 1 shows a regional cross section view of a semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 5. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 shows a regional cross section view of a semiconductor device in accordance with some embodiments of the instant disclosure. The exemplary device includes a substrate 100 over which multiple layers of integrated circuit devices and features are formed. For illustrational simplicity and clarity, some detail/sub components of the exemplary device are not explicitly labeled in the instant figure.

The substrate 100 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 100 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

Several functional regions may be arranged laterally (e.g., horizontally across the page as shown in FIG. 1) over the substrate. By way of example, FIG. 1 shows a substrate of an exemplary device that includes two co-planar arranged functional regions defined thereon, e.g., a cell region 110 and a periphery region 120. In the illustrated example, the cell region 110 provides space to accommodate active circuit components (e.g., selection transistor 112) and passive circuit components (e.g., storage element, such as capacitor 116) of a dynamic random access memory (DRAM) device. Meanwhile, the periphery region 120 houses circuit components for supporting various functions of the DRAM operation, such as read out circuits, decoder circuits, and amplifier circuits. Different functional regions may include circuit components of different critical dimensions based on different design rules. The devices in different functional regions may be designed to function under different operational requirements (e.g., different voltage rage). Devices of different feature dimensions may be arranged on the same plane of a substrate (e.g., circuit chip) to achieve higher degree of integration, hence reduce signal path and enhance device performance.

The cell region may comprise array of memory unit cells. Each of the memory cell units typically includes a bit storage component (e.g., storage capacitor 116) and a selection component (e.g., transistor 112). The unit cells may employ suitable cell architecture, e.g., a 1-T cell format (as shown in the instant example) or other types of cell arrangement (such as a 3T cell layout, not shown). The cell region 110 of the illustrated device are shown to have two gate structures 112 embedded (buried) under a top surface of the substrate 100 in an active region that rests between isolation features 111 (e.g., shallow trench isolation (STI) structure). In some embodiments, the active region may be a raised island structure (with respect to a lower surface of the substrate) comprising an elongated strip overhead profile and surrounded by isolation structure (e.g., STI 111). In some embodiments, the active region may be obliquely arranged with respect to the traversing direction of a word line (e.g., the extending direction of the gate structure 112, which is in/out of the page in the illustrated example) at a slanting angle. The oblique arrangement of the active regions in folded/offset layout may allow more units cells to be packed in a same area while maintaining sufficient distance therebetween, thus achieving higher device density while reducing inter-cell interference (e.g., cross talk).

The gate structure 112 may be part of a memory cell selection device, such as a buried channel array transistor (BCAT). In the illustrated example, the active region (defined between a pair of isolation features 111) comprises a pair of gate structures 112 (corresponding to a pair of BCATs whose respective source/drain (S/D) regions connected to a contact plug, e.g., contact plug/via 114). The contact plug 114 enables electrical connection between the selection transistor (e.g., BCAT) to a lower electrode (e.g., 116L) of a storage capacitor 116 (e.g., through a pad not specifically labeled). The gate structure 112 of an exemplary buried type device may comprise a recess-filling structure (in a cross sectional profile) buried in a gate trench in the active region of the substrate. In practical applications, the gate structure 112 may be a laterally traversing linear structure (e.g., extending in/out of the page of, e.g., FIG. 1) that intercepts multiple adjacent active regions (and serves as a word line (WL) for a memory device).

The gate structure 112 comprises a gate electrode (not labeled) embedded at a lower portion of the gate trench (e.g., partially filling) in the active region. The gate electrode may include one or more conductive material such as doped polysilicon, or metal material such as tungsten or copper. The gate structure 112 also comprises a gate insulation liner that lines the bottom portion of the trench, and is arranged between the gate electrode and the semiconductor material of the active region. The gate insulation liner may be a conformally formed insulating layer covering an inner side wall of the gate trench. The gate insulating liner may be made of insulating material such as silicon oxide, silicon nitride, silicon oxynitride, or a metal oxide. The metal oxide may include, for example, hafnium oxide, aluminum oxide, or titanium oxide. High-K dielectric materials may be utilized to complement metal based gate electrodes for enhancing the performance of a field effect transistor. In some embodiments, the gate structure 112 may further comprise a barrier liner conformally disposed between the gate insulating liner and the gate electrode. The gate barrier liner may comprise a barrier metal compound, such as, titanium nitride (TiN) or tantalum nitride (TaN).

In the quest to pursuit the ever-shrinking device form factor, the utilization of buried type transistor as selection device may ensure extended channel length (e.g., from a S/D region under a contact plug 114 vertically down to the bottom tip of the gate structure 112, then laterally across the tip of to the buried gate electrode and back up to the opposite S/D region under a neighboring contact plug), thereby achieving higher device density while alleviating the accompanied short channel effect. Nevertheless, selection device of other structural architecture may be utilized. For instance, in some embodiments, planar channel device or raised channel multi-gate devices (e.g., fin-type field effect transistor i.e., FINFET) may also be used as selection device for a memory cell.

The contact plug 114 may be formed in and through a dielectric layer (e.g., interlayer dielectric, ILD) above the active region, thereby establishing a vertical conductive path from the surface of the substrate 100 to upper layers of the device stack over the active region. The dielectric layer may be made of materials such as oxide or nitride of silicon. In some embodiments, the dielectric layer may include low-K material having dielectric constant lower than, e.g., 3.9. The contact plug 114 may be made of one or more metal or non-metal conductive material, such as poly-silicon, tungsten, aluminum, etc.

Storage element (such as storage capacitor 116) may be formed over the contact plug 114 (e.g., above the corresponding contact pad over the plug) in a dielectric layer 117. The storage capacitor 116 comprises a lower electrode 116L, an upper electrode 116U, and capacitor dielectric 116D arranged between the upper and the lower electrodes.

A separation layer (e.g., layer 115) may be provided over the contact plug 114, through which the lower electrode of the storage capacitor 116 (e.g., bottom electrode 116L) is formed to establish electrical connection with the contact plug 14. The separation layer may comprise nitride material, e.g., silicon nitride, and serve as etch stop during the fabrication process of the capacitor structure. It is noted that the term "lower" electrode is made with respect to the surface of the substrate for the ease of referral, and shall not be construed as an undue limitation as to device orientation. The contact plug 114 provides a vertical conduction path between the source/drain region of the selection device (e.g., transistor 112) and the lower electrode of the storage element (e.g., electrode 116L).

In some embodiments, the lower electrode 116L may be a cylindrical conductive structure having high aspect ratio (i.e., high depth to width ratio), which corresponds to a tall upward opening U-shaped cross sectional profile (as shown the instant example). In some embodiments, a lateral width of the conductive structure may be few tens of nanometer in scale, e.g., having critical dimension of about 40 nm. In some embodiments, the aspect ratio of the lower electrode 116L may range from about 10 to 40. The lower electrode 116L may be formed from a conformal conductive film made of one or more conductive material(s) such as BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 116D may be a conformally formed layer that comprises a nitride, an oxide, a metal oxide, or a combination thereof. For example, the capacitor dielectric 116D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 116U may be formed of one or more conductive material such as doped semiconductor, conductive metal nitride, metal, metal silicide, conductive oxide, or a combination thereof. For instance, the upper electrode 116U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive. Additional conductive features, such as upper metallization feature 118 and additional inter metal dielectric layers may be formed over the dielectric layer 117 and the upper electrode 116U to enable interconnection between circuit elements.

The periphery region 120 may comprise various active device regions laterally separated by isolation features, such as STI 121. The active region may comprise active circuit components (such as transistors) that make up the periphery support circuits, e.g., read-out, decoder, or amplifier circuits. Over the active region there may be upper inter device layers, such as dielectric layer 127, through which contact via/plug 124 may be provided to enable vertical signal conduction from the surface of the substrate 100 to a higher device layer. The contact plug 124 may be connected to a corresponding contact pad (not specifically labeled) thereabove in a fashion similar to that in the cell region 110.

Over the contact plug 124 of the presently illustrated embodiment is a dielectric layer 127, through which one or more high aspect ratio interconnect features (e.g., contact via 126) are formed. In some embodiments, the aspect ratio of the contact via 126 may have a range from about 10 to 40. In some embodiments, the dielectric layer 127 may be (at least partially) an lateral extension of the dielectric layer 117 from the cell region 110. In some embodiments, the design rules for the devices in periphery region 120 may assume a greater feature sizes than that in the cell region 110. In some embodiments, the active circuit components in the periphery region 120 are designed to operate at a higher voltage level than those in the cell region 110.

The high aspect ratio features in both the cell region 110 and the periphery region 120 are typically formed through a top-down fashion, such as etching. The etching of high aspect ratio features often takes place through one or more relatively thick device layer (e.g., interlayer dielectric 117 and 127). As etching operation proceeds to deeper into the dielectric layer, the residual and the narrow topology of the etched profile makes removing materials more difficult as depth increases. As such, a tapered etch profile is often resulted in the high aspect ratio feature. Sometimes the taper angle of such high aspect ratio feature may deviate substantially from a normal direction with respect to a substrate surface. In some applications, the substantially tapered feature profile may hinder device performance.

For instance, the conductance quality of the high aspect ratio interconnect feature (e.g., via/plug 127) is related to a cross-sectional area thereof. A tapered etch profile leads to reduced cross sectional area (e.g., at lower section of the plug), which results in increased electrical resistance. Similarly, the performance of a capacitor (e.g., cell capacitor 116) is proportionally related to a surface area of the electrode. Although a high aspect ratio profile may provide increased operational efficiency of the storage capacitor 116, a tapered feature profile (with respect to a normal of the substrate, e.g., wider top, narrower bottom) in a capacitor structure still does not maximize electrode surface area, thus undermining device performance. Accordingly, in some embodiments, special process arrangement and technique could be utilized to generate high aspect ratio feature having lateral/sidewall profile that is substantially normal (vertically perpendicular) with respect to a major surface of the substrate.

Figure 2:
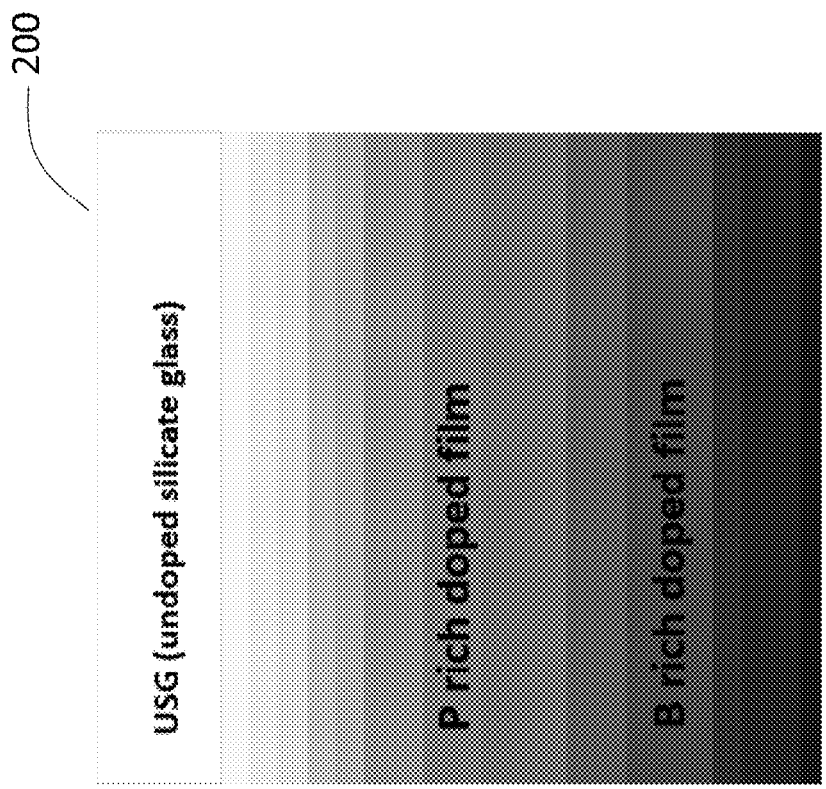
FIG. 2 illustrates a schematic dopant profile of a dielectric layer in accordance with some embodiments of the instant disclosure.

FIG. 2 illustrates a schematic dopant profile of a dielectric layer in accordance with some embodiments of the instant disclosure. The exemplary dielectric layer 200 may be applied as interlayer dielectric over an active region of a semiconductor structure (e.g., interlayer dielectric 117 and 127 as illustrated in FIG. 1) to facilitate the generation of high aspect ratio features with substantially vertical lateral profile (with respect to a major surface of the substrate).

The exemplary dielectric layer 200 comprises stepped dopant concentration distribution that includes multiple distinct dopant species. As illustrated by the color scale shown in FIG. 2, the overall dopant concentration level generally decreases from lower region to an upper region (e.g., deeper color tone at the bottom level indicates heavier overall dopant content level, while lighter color tone toward the top level indicates lighter dopant concentration). In some embodiments, a thickness of the dielectric layer 200 may range from about 5000 to about 15000 Å.

Each horizontal level of the dielectric layer 200 may comprise at least two dopant species, whereas a total dopant content in each horizontal level increases from the top level of the dielectric layer 200 to the bottom level thereof. In some embodiments, the dielectric layer comprises oxide dielectric materials such as silicate glass. As shown in the illustrated embodiment, the upper most level of the dielectric layer 200 comprises undoped silicate glass (USG), which presents substantially no dopant content therein. As depth increases, the lower level of the dielectric layer 200 may comprise doped silicate glass having multiple dopant species, e.g., phosphorous silicate glass (PSG), borosilicate glass (BSG), or Borophosphosilicate glass (BPSG).

In some embodiments, each horizontal level in the dielectric layer 200 includes two different dopant species. In some embodiments, the distinct dopant species includes phosphorous and boron. The content ratio between distinct dopant species in each horizontal level of the dielectric layer 200 defines a inter-dopant ratio. To meet device performance of certain applications, the inter-dopant ratio may be designed to vary in accordance with a depth of the dielectric layer 200. By way of example, in the schematic illustration of FIG. 2, while the overall dopant concentration level increases along the depth of the dielectric layer 200, the inter-dopant ratio between distinct dopant types (e.g., ratio of phosphorous to boron, P/B) does not remain constant. In the illustrated embodiment, the phosphorous content is greater toward an upper level and the dielectric layer 200, while the boron content increases toward a bottom level thereof. Accordingly, an inter-dopant ratio between phosphorous and boron dopants (i.e., $C_P/C_B$) increases as the depth decreases toward the top of the dielectric layer 200.

The gradient increase in overall dopant density in the dielectric layer 200 helps to modify regional etch selectivity therein, whereby higher dopant concentration at a greater depth (e.g., toward a bottom region) may affect a greater regional etching rate (which helps to compensate for the gradually decreased etch rate due to increased etching difficulties as etch depth deepens). On the other hand, the change in inter-dopant ratio may be designed to improve device characteristics. For instance, a heavy total dopant concentration with reduced phosphorous to boron inter-dopant ratio at deeper region of the dielectric layer 200 may warrant an increased etch rate while reducing ion-gettering effect at the bottom region close to the contact plug 114, thereby enhancing electrical efficiency of the capacitor device 116 (e.g., reduce parasitic capacitance).

In some embodiments, the dielectric layer 200 may be employed in an inter-metal layer (IMD) of a semiconductor device, in which one or more layers of conductive interconnect features are formed. In some embodiments, a thickness of the dielectric layer 117 may be designed to support the generation of high aspect ratio features with substantially vertical sidewall profiles. In some embodiments, an overall thickness of the dielectric layer 200 may range from about 5000 to 150000 Å.

Figures 3A, 3B:
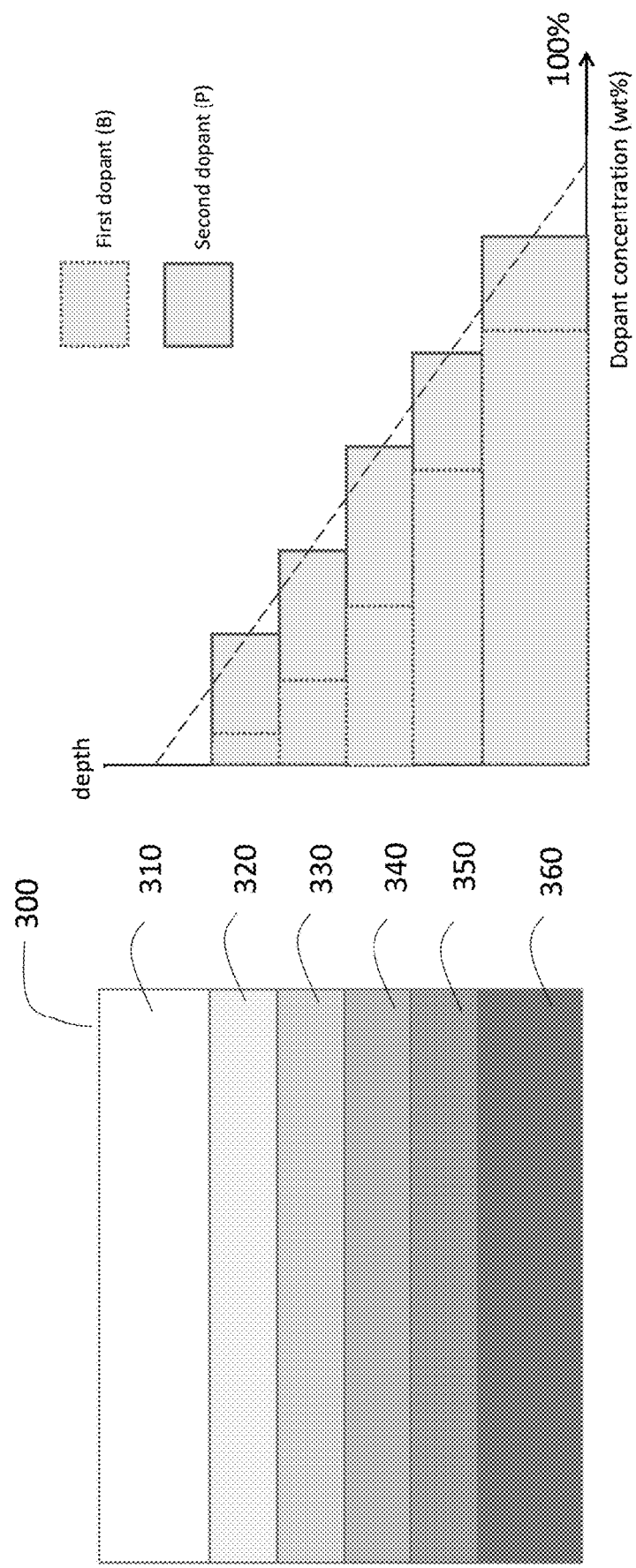
FIGS. 3A and 3B illustrate a exemplary dielectric stack and a corresponding dopant profile along a depth thereof in accordance with some embodiments of the instant disclosure.

FIG. 3A illustrates an exemplary dielectric stack, while FIG. 3B shows a corresponding dopant profile along a depth thereof, in accordance with some embodiments of the instant disclosure. A dielectric layer (e.g., dielectric layer 300) in accordance with the instant disclosure may be a composite layer formed by a plurality of dielectric (sub)layers. As schematically illustrated in FIG. 3, from bottom to top, the exemplary dielectric layer 300 comprises sequentially and vertically stacked dielectric layers 360, 350, 340, 330, 320, and 310 with different dopant content profiles.

In the illustrated example, dielectric layer 300 is made up with five doped sub-layers (layers 320-360) and one undoped layer (layer 310). In many applications, it is found that a composite dielectric layer composed of five or more layers yields satisfactory results in the generation of high aspect ratio features with vertical sidewall profile. In some embodiments, each (sub)layer comprises two or more dopant species arranged at different content levels (e.g., by wt %). For instance, in the instant embodiment, each of the dielectric layers 320-360 comprises boron and phosphorous dopants, which defines a total dopant concentration as well as an inter-dopant ratio (P/B). In some embodiments, a combined dopant level remains substantially uniform within each one of the (sub)layers. That is, the dopant distribution within a (sub)layer is substantially uniform (or evenly distributed). In some embodiments, an inter-dopant ratio between different dopant species (e.g., the ratio of P/B) is substantially constant within each of the (sub)layers. Accordingly, the combined dopant concentration distribution along a depth of the dielectric layer 300 presents a substantially stepped profile.

The content level (e.g., concentration) of distinct dopant species within each one of the dielectric (sub)layers, as well as the thickness thereof, may be designed to vary from layer to layer. By way of example, a boron dopant concentration in each of the dielectric (sub)layers may range from about 0 to about 15 weight percentage (wt %). By way of further example, a phosphorous dopant concentration in each of the dielectric (sub)layers may range from about 0 to about 30 wt %. In addition, in the illustrated embodiment, the upper and bottom most layers 310 and 360 are formed with greater thickness than the middle layers 320-350 (which are designed to have substantially identical thickness).

The combined dopant level (i.e., sum of all the distinct dopant species, e.g., B and P in the illustrated example) forms a substantially stepped profile that decreases substantially linearly from a lower layer to a subsequent layer. For example, as shown in FIG. 3B, the dashed line indicates a substantially linearly decreasing trend of average dopant level toward the upper region of the stack. FIG. 3B further illustrates the variation of inter-dopant ratio (P/B) across each of the dielectric (sub)layers.

For instance, in the illustrated embodiment, the bottom most layer 360 comprises the greatest combined dopant level, with a lowest inter-dopant P to B ratio (e.g., with a roughly 2:9 ratio). Lower layer 350 has a one step reduced combined dopant level compared to layer 360, but has an increased inter-dopant P to B ratio (e.g., with a roughly 2:5 ratio).

The combined dopant level in the subsequent layer 340 further decreases, while the phosphorous content level increases further with respect to that of boron (e.g., with a roughly 1:1 ratio). In layer 330, the combined dopant level is one step reduced than its lower neighboring layer, yet the phosphorous content level increases with respect to that of the boron (e.g., with a roughly 5:2 ratio). In layer 320 at an upper region of the stack, while the combined dopant level is the lowest among all doped layers, the phosphorous content level is significantly greater than that of the boron (e.g., with a roughly 3:1 ratio). Finally, the upper most layer 310 comprises primarily USG, and thus corresponds to a substantially zero dopant concentration.

In some applications, it is found that the exemplary arrangement as discussed above facilitates the generation of high aspect ratio features with steep, near vertical sidewall profiles with improved electrical characteristics. For one thing, a dielectric layer with insufficient steps of dopant variations would not yield a near-vertical lateral etch profile. Moreover, the inter-dopant ratio variation across the stacked layers helps to alleviate adverse phenomenon such as ion getting effect at a lower contact region of a circuit component, thereby improving the electrical characteristics of a semiconductor device. In addition, for structural integrity and process reliability, in some embodiments, the uppermost and the bottommost layers 310 and 360 may be formed with greater thickness than those of the middle layers. In some embodiments, the lower-most dielectric layer is provided with a thickness of about 0.1-10% of the total thickness of the multiple dielectric layer stack. In some embodiments, the top undoped layer is provided with a thickness of about 5-40% of the total thickness of the multiple dielectric layer stack.

FIGS. 4A-4J show exemplary fabrication processes of a semiconductor device in accordance with some embodiments of the instant disclosure.

Referring to FIG. 4A, a substrate 400 capable of providing mechanical support for subsequently formed device components and features is received for fabrication processing. The illustrated substrate 400 comprises two functional regions 410 and 420, in which various features (e.g., isolation features 411) and device components (e.g., transistor gate structure 412) may be formed. In the illustrated example, region 410 is to be designated as a memory cell region, while region 420 is to be formed into a periphery region.

Figure 4B:
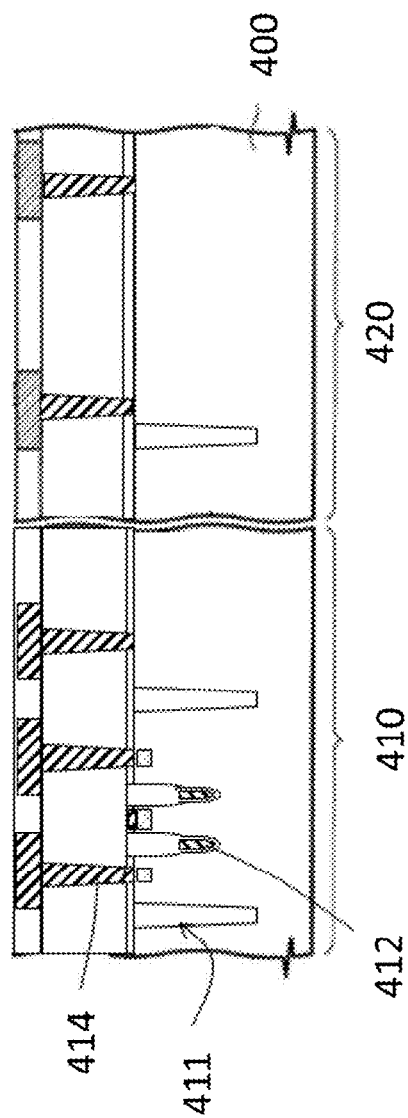

Referring to FIG. 4B, a lower device layer is formed over the functional regions 410 and 420. The lower device layer may comprise inter layer dielectrics and one or more interconnect elements (e.g., contact pad/via plug 414) penetrating there-through. The contact plug 414 enables vertical signal connection from a surface of the substrate to a subsequently formed upper device layer.

Figure 4C:
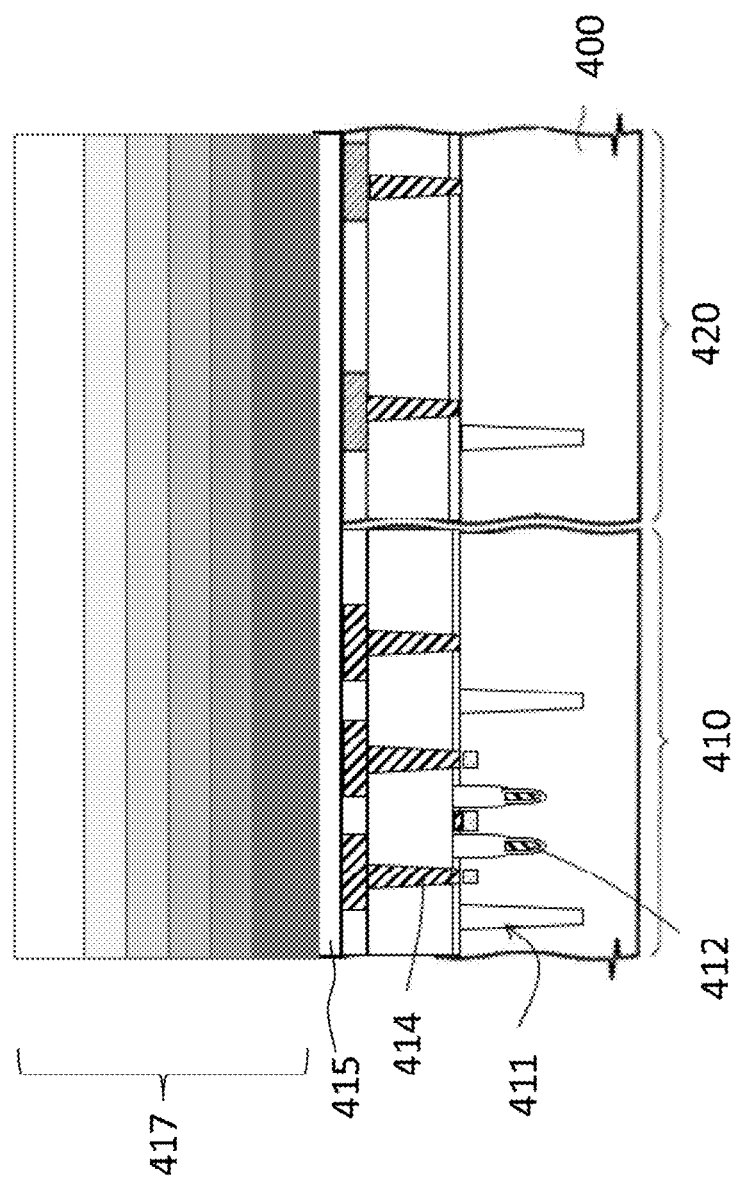

Referring to FIG. 4C, a separation layer 415 is blanket over the lower device layer. The separation layer 415 may be a blanket disposed nitride containing layer having a substantially uniform thickness. In some embodiments, the separation layer 415 comprises SiON dielectric material. In some embodiments, the separation layer 415 is formed by atomic layer deposition (ALD) process. The separation layer 415 may serve as an etch stop layer in the subsequent recess formation process.

A dielectric layer 417 that possesses gradient dopant content variation along its depth is then disposed over the separation layer 415. By way of example, dielectric layer 417 may comprise a stacked arrangement as exemplified in the previous discussion with respect to FIGS. 3A and 3B. To ensure reliability in the subsequent recessing process for generating a substantially vertical etch profile, the dielectric layer 417 is provided with five or more steps of dopant gradients. In the illustrated example, six sub-layers with varying dopant content levels are used in the dielectric layer 417, which translates to six dopant gradient steps.

The dielectric layer 417 may be formed by using thin film formation techniques including physical vapor deposition (PVD), chemical vapor deposition (CVD), plasma enhanced chemical vapor deposition (PECVD), sub-atmospheric thermal chemical vapor deposition (SACVD), and high density plasma chemical vapor deposition (HDPCVD). Each sub-layer of the dielectric layer 417 may be formed with multiple distinct dopant species. In the illustrated embodiment, the dielectric layer 417 includes phosphorous and boron dopant species. The dopant may be provided through the introduction of precursors such as Triethyl phosphate (TEPO) and trimethyl borate (TMB) during film formation process, respectively. The dielectric layer 417 may be formed to a thickness of about 500 to about 1500 nm. The dopant concentration level across the depth of the dielectric layer 417 may be adjusted, e.g., by adjusting dopant source recipe during thin film formation. In the illustrated embodiment, the bottommost doped sub-layer is provided with greater thickness than the stacked upper doped layers. The dopant profile arrangements and other design rules may be comparable to that discussed previously with respect to FIGS. 3A and 3B, therefore will not be repeated here for the sake of disclosure brevity.

Figure 4D:
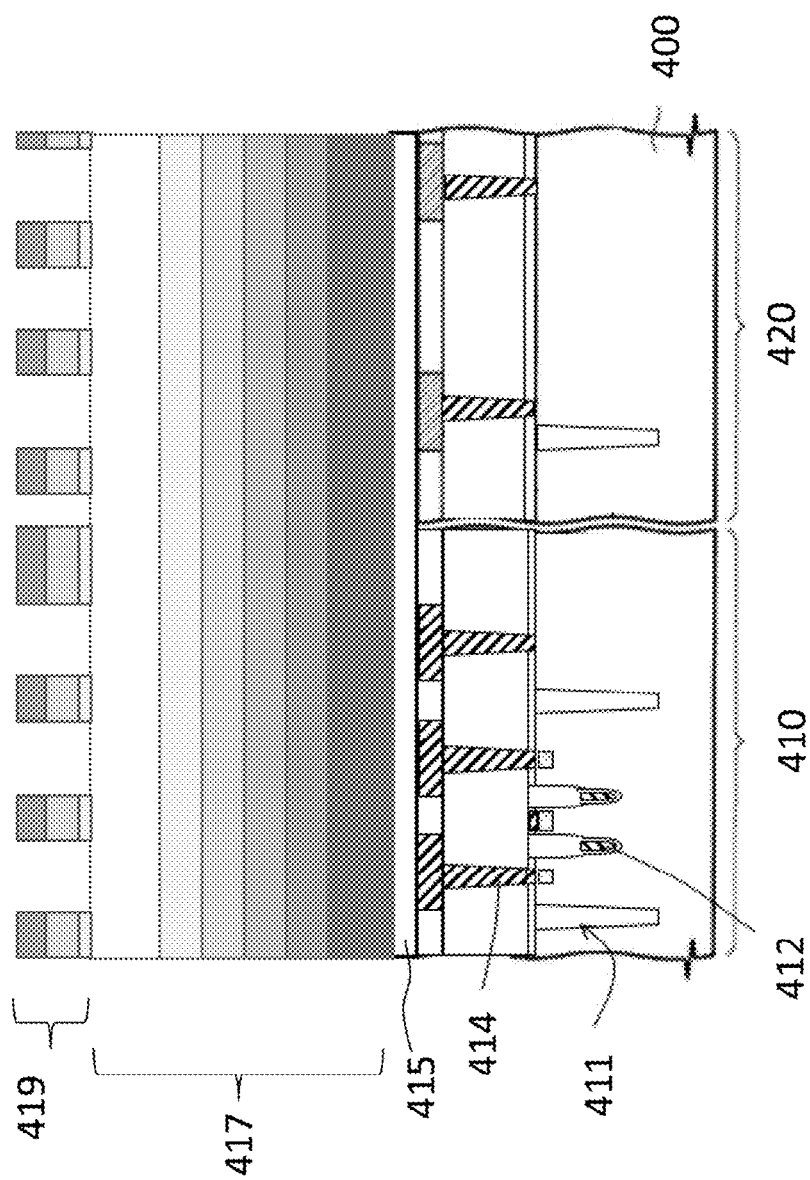

Referring to FIG. 4D, mask film stack 419 is formed (and patterned) over the dielectric layer 417 in preparation for subsequent photolithography process. The mask film stack 419 may include mask layer, hard mask layer, and antireflection layer for photo-patterning and hole generation. In some embodiments, the mask film stack 419 employs a SiCN layer as hard mask layer. In some embodiments, mask film stack 419 includes a SiON layer as antireflection layer. In some embodiments, mask film stack 419 includes tetraethylorthosilance (TEOS) film as mask layer for photolithography pattern transfer. In some embodiments, one or more support layer may be provided in the mask film stack 419 over the dielectric layer 417. The support layer may comprise nitride material, e.g., SiN, and act as an anchor to provide mechanical support for the subsequently formed high aspect ratio features (such as the lower capacitor electrode 416L shown in FIG. 4G). In some embodiments, inorganic material in the mask film stack 419 may be formed by thin film deposition techniques such as PECVD. In some embodiments, the mask film stack 419 may be partially or fully removed upon completion of pattern transfer and subsequent etching processes.

Prior to a high aspect ratio etching process as shown in FIG. 4E, a thermal process may be applied to the dielectric layer 417. A thermal treatment such as thermal anneal, rapid thermal anneal (RTA), or other types of annealing processes may help improving the film quality of the dielectric layer 417. In some embodiments, the thermal operation may take place in an ambient temperature of about 100 to 1000° C. for a duration of 10 to 180 minutes. In some embodiments, the thermal operation is performed in an oxidation or inter atmospheric condition. In some embodiments, the thermal operation is carried out in substantially pure $O_2$ or $H_2O_2$ vapor ambient to ensure/maintain dopant uniformity at a sidewall region in the dielectric layer 417.

As shown in FIG. 4E, etching operation is performed to generate a plurality of high aspect ratio recess features in the dielectric layer 417 through the mask film stack 419. For illustration clarity, FIG. 4E is focused on only the cell region 410. The etching operation may utilize anisotropic dry or wet etching techniques, or a combination thereof. The etching operation generates a plurality of deep, narrow holes that exposes the separation layer 415.

Referring to FIG. 4F, in a further etching process, the separation layer 415 is at least partially removed to expose the interconnect feature (e.g., contact via/pad 414) in a lower device layer. In some embodiments, the further etching operation through the separation layer 415 may utilize an etching process different from that used for generating high aspect ratio recess features through the dielectric layer 417.

For the simplicity of illustration, the following drawings will show a scenario where the mask film stack 419 is fully removed during the subsequent capacitor formation process.

Figure 4G:
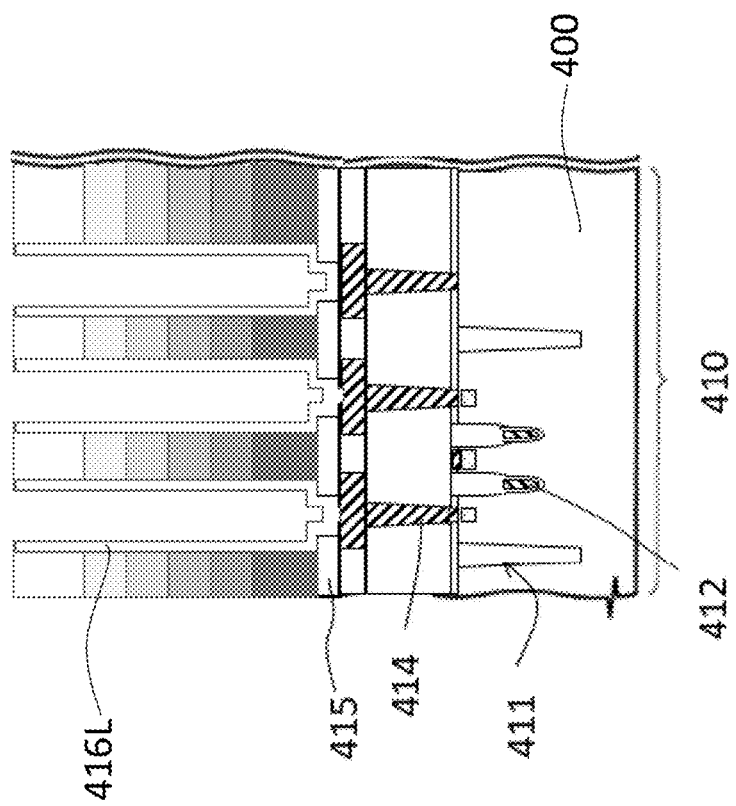
Figure 4J:
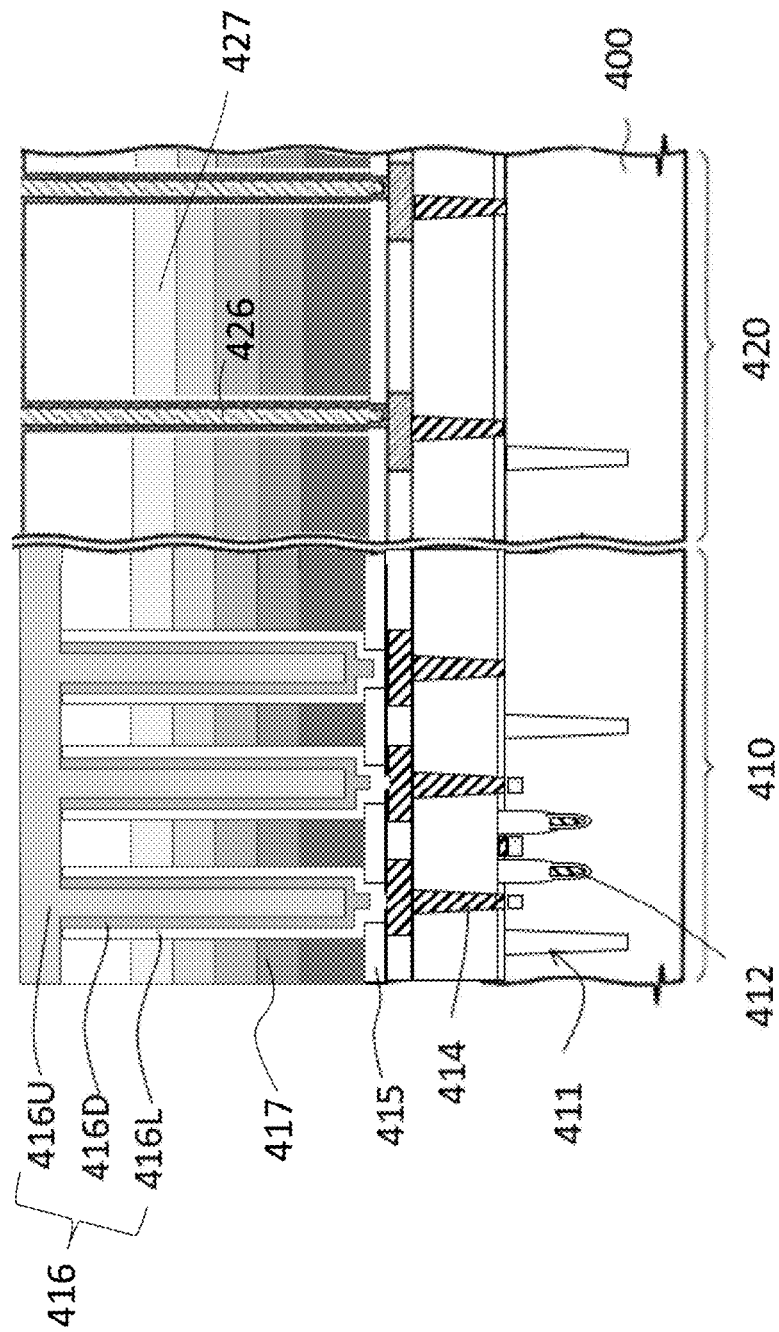

Referring to FIG. 4G, a substantially conformal conductive liner is disposed over the exposed surfaces of the high aspect ratio recess feature having substantially vertical sidewall profile (without filling the long and narrow recess). The conductive liner in the recess feature forms a long and narrow cylindrical structure (cylindrical tube) with a sidewall profile that is substantially normal to the major surface of the substrate 400. Moreover, the vertically extending cylindrical structure electrically connects the interconnect feature (e.g., via/pad 414) of a lower device layer through the removed portion of the separation layer 415, thereby defining a lower electrode 416L of a subsequently formed storage capacitor (e.g., storage capacitor 416 as shown in FIG. 4J). In some embodiments, a lateral width of the lower electrode 416L is in an order of tens of nanometers, e.g., about 40 nm.

The conductive liner for the lower electrode 416L may be formed by techniques such as CVD, ALD, or metal-organic CVD (MOCVD). Suitable conductive material for the lower electrode liner may include doped semiconductor, conductive metal nitride, metal, metal silicide, conductive oxide, or a combination thereof. By way of example, the lower electrode 416L may be formed by one or more conductive material including TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr$)$RuO_3$), CRO ($CaRuO_3$), LSCo (($La,Sr$)$CoO_3$).

Referring to FIG. 4H, a dielectric liner is conformally formed over the exposed inner and bottom surfaces of the lower electrode 416L (without fully filling the recess feature in the dielectric layer 417). The dielectric liner will serve as capacitor dielectric 416D for the subsequently formed capacitor (e.g., storage capacitor 416 shown in FIG. 4J).

The conformal dielectric liner for the capacitor dielectric 416D may be formed by techniques such as CVD, PVD, or ALD, and may comprise one or more nitride, oxide, metal oxide material(s). By way of example, the capacitor dielectric 416D may be a single or a multilayered film formed from silicon nitride, silicon oxide, a metal oxide (e.g., $HfO_2$, $ZrO_2$, $Al_2O_3$, $La_2O_3$, $Ta_2O_3$, and $TiO_2$), a perovskite dielectric material (e.g., STO ($SrTiO_3$), BST ($(Ba,Sr)TiO_3$), $BaTiO_3$, PZT, and PLZT, or a combination thereof. In some embodiments, high-K dielectrics may be used to boost device performance, e.g., enhance capacitance for a given electrode size.

Referring to FIG. 4I, conductive material is disposed over capacitor dielectric 416D to fully fill the recess feature(s) in the dielectric layer 417, thereby forming an upper electrode 416U for the capacitor 416. In the illustrated embodiments, the upper portion of the plurality of upper electrodes (that respectively extending into the high aspect ratio recess features in the dielectric layer 417) are electrically connected, thereby forming a common capacitor electrode. The upper electrode 416U may selectively include one or more conductive material comparable to that for the lower electrode 416L, and may be formed by CVD process, MOCVD process, PVD process, or ALD process.

Figure 5A:
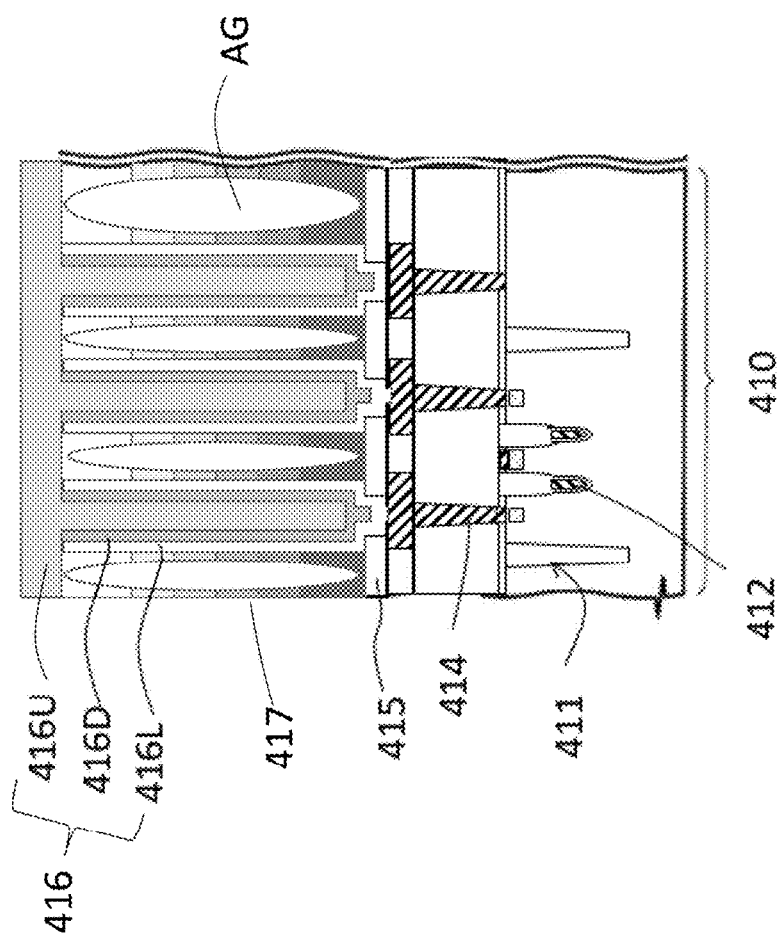
FIGS. 5A and 5B respective illustrate semiconductor devices in accordance with alternative embodiments of the instant disclosure.

Referring ahead to FIG. 5A, which illustrates a semiconductor device in accordance with an alternative embodiment of the instant disclosure. In the illustrated embodiment, air gaps AG are formed in the dielectric layer 417 between adjacent bottom electrodes 416L. The air gap AG may be formed by partially removing the dielectric layer 417 through etching. As air gap possesses very low dielectric constant, the provision of air gaps between neighboring capacitor electrodes may help to reduce parasitic capacitance between storage cells, thereby enhancing operational efficiency of the device. It is noted that the specific shape and size of an air gap may vary in accordance with the formation process, and may not necessarily appear as the schematic illustration shown in the exemplary figure.

Figure 5B:
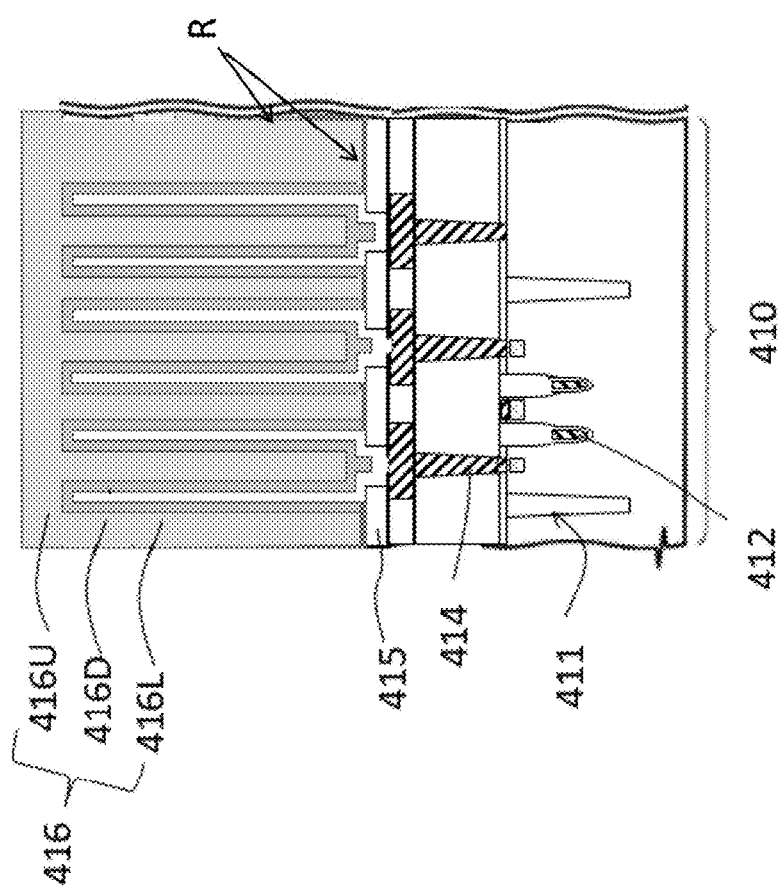

Referring to FIG. 5B, which illustrates a semiconductor device in accordance with another alternative embodiment of the instant disclosure. In the illustrated embodiment, the portion of the dielectric layer 417 between adjacent lower electrodes 416L is substantially removed, and its occupied volume is generally replaced by conductive materials for the upper electrode 416U. As a result, the volume of the common upper electrode 416U may be noticeably increased. An increased upper electrode volume translates to increased electrode surface area, thereby effectively increases the capacitance of the storage capacitor 416. The removal of the dielectric layer 417 may be achieved through etching. In some embodiments, etching operation may leave residual (e.g., residual R) of the dielectric layer 417 at a sidewall and/or bottom region between the neighboring lower electrodes 416L.

Please refer back to FIG. 4J, which shows a regional cross section view of a semiconductor device during an intermediate stage of fabrication, in accordance with some embodiments of the instant disclosure. Particularly, FIG. 4J shows a pair of laterally arranged functional regions 410 and 420 over a substrate 400 upon the formation of high aspect ratio features such as capacitor(s) 416 and contact via(s) 426. The arrangement of the dielectric layer 417 (and the lateral counterpart 427 that extends over the functional region 420) enables the generation of high aspect ratio features with nearly vertical lateral sidewall profile (with respect to the surface of the substrate 400). In many applications, the vertical sidewall profile of the high aspect ratio features leads to improved device performance. For one thing, the vertical profile provides a widened width at the bottom portion of the high aspect ratio features, thereby increasing its contact area with the interconnect features 414 in the lower device layer, which in turn lowers the contact resistance there-between. The vertical sidewall profile of the contact via 426 generates a substantially uniformed width across its length, which also reduces electrical resistivity at a bottom portion thereof. Moreover, a vertical sidewall profile of the bottom electrode 416L effectively increases a surface area of the electrode at the bottom section of the capacitor 416, which leads to increased capacitance and therefore enhanced device performance.

In subsequent fabrication processes, passivation/capping layers may be formed over the upper electrode 416U and the contact via 426. In addition, further device layers and interconnect features may be provided over the functional regions 410 and 420 to connect various circuit components, thereby enabling high density vertical integration in the IC device (e.g., as illustrated in the exemplary embodiment shown in FIG. 1).

Accordingly, some embodiments of the instant disclosure provide a method of fabricating semiconductor device, which comprises: receiving a substrate having a device region with a contact plug arranged there-over that enables electrical connection to a semiconductor device therein; disposing a separation layer over the contact plug; disposing over the separation layer a dielectric layer with stepped dopant concentration distribution that comprises of two distinct dopant species, the deposition of dielectric layer including: disposing a stack of a plurality of doped dielectric sub-layers, each sub-layer having a substantially uniform dopant concentration and an inter-dopant ratio; wherein the dopant concentration decreases from a lower sub-layer to a higher sub-layer, and wherein the inter-dopant ratio between the two distinct species increases from a lower sub-layer to a higher sub-layer; and forming a recess feature through the dielectric layer to expose the contact plug, wherein the recess feature has a sidewall profile that is substantially perpendicular to a surface of the substrate.

In some embodiments, the distinct dopant species includes boron and phosphorous, and the inter-dopant ratio includes a ratio of phosphorous to boron (P/B).

In some embodiments, the disposing of a dielectric layer includes disposing B dopant concentration in each of the sub-layers from 0 to 15 wt %, and disposing P dopant concentration in each of the sub-layers ranges from 0 to 30 wt %.

In some embodiments, the doped dielectric sub-layer nearest the separation layer is formed with greater thickness then the upper-stacked doped sub-layers.

In some embodiments, the doped dielectric sub-layers in the middle portion of the stack comprises substantially identical thickness.

In some embodiments, an undoped dielectric layer is further provided over the stack of doped dielectric sub-layers.

In some embodiments, the undoped dielectric layer is formed with a thickness greater than that of the doped dielectric sub-layers in the middle portion of the stack.

In some embodiments, the dopant concentration in the sub-layer is reduced substantially linearly from a lower sub-layer to a subsequent sub-layer.

In some embodiments, a thermal process is further performed prior to the forming of recess feature.

In some embodiments, the method further comprises conformally disposing a conductive liner over sidewall and bottom surfaces of the recess feature to form a cylindrical tube with predetermined aspect ratio in the recess feature that electrically connects the contact plug.

Accordingly, some embodiments of the instant disclosure provide a method of generating a recess feature, which comprises: disposing a lower dielectric layer that includes a plurality of distinct dopant species having a combined dopant level and at a inter-dopant ratio over a substrate; disposing a higher subsequent dielectric layer with a decreased combined dopant level and at an increased inter-dopant ratio; wherein the dielectric layer deposition process is iterated for a plurality of times; performing an etch operation to generate a recess feature respectively through the stack of multiple dielectric layers, wherein the recess feature has sidewalls that are substantially parallel to each other.

In some embodiments, the combined dopant level is reduced substantially linearly from a lower layer to a subsequent layer.

In some embodiments, the distinct dopant species includes boron and phosphorous, and the inter-dopant ratio includes a ratio of phosphorous to boron (P/B).

In some embodiments, the B dopant concentration in each of the dielectric layers ranges from 0 to 15 wt %.

In some embodiments, the P dopant concentration in each of the dielectric layers ranges from 0 to 30 wt.

In some embodiments, the dielectric layer deposition process comprises disposing a combined dopant level substantially uniformly within a dielectric layer.

In some embodiments, the dielectric layer deposition process is iterated for a total of at least five times.

In some embodiments, the disposing of a lower dielectric layer comprises forming a lower-most dielectric layer having a greater thickness than a stacked higher subsequent dielectric layer.

In some embodiments, a higher subsequent dielectric layer in the middle portion of the stack comprises substantially identical thickness.

In some embodiments, an undoped dielectric layer is further formed at the top of the dielectric layer stack.

In some embodiments, the undoped dielectric layer is formed with a thickness greater than that of the higher subsequent dielectric layers in the middle portion of the stack.

In some embodiments, the lower-most dielectric layer is provided with a thickness of about 0.1-10% of the total thickness of the multiple dielectric layer stack.

In some embodiments, the top undoped layer is provided with a thickness of about 5~40% of the total thickness of the multiple dielectric layer stack.

In some embodiments, the method further comprises: performing an thermal process prior to the etch operation.

Accordingly, some embodiments of the instant disclosure provide a semiconductor structure that comprises: a substrate having a device region; a contact plug arranged over the device region and enables electrical connection to a semiconductor device in the device region; a separation layer arranged above and exposing the contact plug; a cylindrical tubular conductive feature arranged above the separation layer; and a dielectric layer laterally surrounding the cylindrical tubular metal feature, having a substantially stepped dopant concentration distribution comprised of two distinct dopant species, wherein the dopant concentration level decreases from a lower region nearest the separation layer toward a upper region further from the separation layer; wherein an inter-dopant ratio between the distinct dopant species increases from the lower region toward the upper region; and wherein the cylindrical tubular metal feature has a sidewall profile that is substantially perpendicular to a surface of the substrate.

In some embodiments, the distinct dopant species includes boron and phosphorous, and the inter-dopant ratio includes a ratio of phosphorous to boron (P/B).

In some embodiments, the dielectric layer includes B dopant concentration in a range from 0 to 15 wt %, and the P dopant concentration therein ranges from 0 to 30 wt %.

In some embodiments, the dielectric layer comprises at least 5 steps of graded dopant concentration levels along its depth.

The embodiments shown and described above are only examples. Many details are often found in the art such as the other features of a logistics data management method. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A method of fabricating semiconductor device, comprising:
   receiving a substrate having a device region with a contact plug arranged there-over that enables electrical connection to a semiconductor device therein;
   disposing a separation layer over the contact plug;
   disposing, over the separation layer, a dielectric layer with stepped dopant concentration distribution that comprises of two distinct dopant species, the deposition of dielectric layer including:
      disposing a stack of a plurality of doped dielectric sub-layers, each sub-layer having a substantially uniform dopant concentration and an inter-dopant ratio;
      wherein the dopant concentration decreases from a lower sub-layer to a higher sub-layer, and
      wherein the inter-dopant ratio between the two distinct species increases from a lower sub-layer to a higher sub-layer; and
   forming a recess feature through the dielectric layer to expose the contact plug,
      wherein the recess feature has a sidewall profile that is substantially perpendicular to a surface of the substrate.

2. The method of claim 1,
   wherein the distinct dopant species includes boron and phosphorous, and
   wherein the inter-dopant ratio includes a ratio of phosphorous to boron (P/B).

3. The method of claim 1,
   wherein the disposing of a dielectric layer includes disposing B dopant concentration in each of the sub-layers from 0 to 15 wt %, and
   disposing P dopant concentration in each of the sub-layers ranges from 0 to 30 wt %.

4. The method of claim 1,
wherein the doped dielectric sub-layer nearest the separation layer (415) is formed with greater thickness than the upper-stacked doped sub-layers.

5. The method of claim 1,
wherein the dopant concentration in the sub-layer is reduced substantially linearly from a lower sub-layer to a subsequent sub-layer.

6. The method of claim 1,
further comprising performing a thermal process prior to the forming of the recess feature.

7. The method of claim 1,
further comprising conformally disposing a conductive liner over sidewall and bottom surfaces of the recess feature to form a cylindrical tube with predetermined aspect ratio in the recess feature to electrically connect the contact plug.

8. A method of generating a recess feature, comprising:
disposing a lower dielectric layer that includes a plurality of distinct dopant species having a combined dopant level and at an inter-dopant ratio over a substrate;
disposing a higher subsequent dielectric layer with a decreased combined dopant level and at an increased inter-dopant ratio;
wherein the dielectric layer deposition process is iterated for a plurality of times; and
performing an etch operation to generate a recess feature respectively through the multiple dielectric layers, wherein the recess feature has sidewalls that are substantially parallel to each other.

9. The method of claim 8,
wherein the combined dopant level is reduced substantially linearly from a lower layer to a higher subsequent layer.

10. The method of claim 8,
wherein the distinct dopant species includes boron and phosphorous, and
wherein the inter-dopant ratio includes a ratio of phosphorous to boron (P/B).

11. The method of claim 10,
wherein the disposing of a lower dielectric layer comprises forming a lower-most dielectric layer having a greater thickness than a stacked higher subsequent dielectric layer.

12. The method of claim 10,
wherein the B dopant concentration in each of the dielectric layers ranges from 0 to 15 wt %.

13. The method of claim 10,
wherein the P dopant concentration in each of the dielectric layers ranges from 0 to 30 wt %.

14. The method of claim 8,
wherein the dielectric layer deposition process comprises disposing a combined dopant level substantially uniformly within a dielectric layer.

15. The method of claim 8,
wherein the dielectric layer deposition process is iterated for a total of at least five times.

16. The method of claim 8,
further comprising: performing an thermal process prior to the etch operation.

* * * * *